(12) United States Patent
Hodgetts et al.

(10) Patent No.: US 7,161,425 B2
(45) Date of Patent: Jan. 9, 2007

(54) RADIO FREQUENCY POWER AMPLIFIER FOR LOSSLESS POWER COMBINING

(75) Inventors: Michael W. Hodgetts, Long Valley, NJ (US); Liang Hung, Short Hills, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/011,988

(22) Filed: Dec. 14, 2004

(65) Prior Publication Data

US 2006/0125558 A1    Jun. 15, 2006

(51) Int. Cl.
*H03F 3/68* (2006.01)

(52) U.S. Cl. .................... 330/124 R; 330/53; 330/295; 330/286

(58) Field of Classification Search ............ 330/124 R, 330/53, 295, 286
See application file for complete search history.

(56) References Cited

U.S. PATENT DOCUMENTS

| | | | | |
|---|---|---|---|---|
| 4,772,856 A | * | 9/1988 | Nojima et al. .............. | 330/251 |
| 4,780,685 A | * | 10/1988 | Ferguson ................. | 330/124 D |
| 4,965,530 A | * | 10/1990 | Katz ........................... | 330/295 |
| 5,105,167 A | * | 4/1992 | Peczalski .................... | 330/295 |
| 5,274,341 A | * | 12/1993 | Sekine et al. ............... | 330/269 |
| 6,836,183 B1 | * | 12/2004 | Wight .................... | 330/124 R |

* cited by examiner

*Primary Examiner*—Patricia Nguyen

(57) ABSTRACT

An amplifier device (40) includes at least one amplifier (42) having an output. A plurality of conductors (48, 50, 52) are coupled to the output in parallel with each other. The plurality of conductors (48, 50, 52) each has an electrical length that corresponds to a quarter wavelength of a signal amplified by the amplifier. The electrical length of the conductors (48, 50, 52) allows for any one of them to be selectively shorted so that the shorted conductor appears as an open circuit relative to the output of the amplifier (42) and has no effect on the operation of the amplifier device under such circumstances. The disclosed amplifier configuration allows for daisy chain connections for stacking amplifiers to increase amplification in an effectively lossless manner.

13 Claims, 2 Drawing Sheets

RADIO FREQUENCY POWER AMPLIFIER FOR LOSSLESS POWER COMBINING

FIELD OF THE INVENTION

This invention generally relates to radio frequency signal amplification. More particularly, this invention relates to an amplifier arrangement that allows for combining amplifiers in a lossless manner.

DESCRIPTION OF THE RELATED ART

Wireless communications are well known. In telecommunications, for example mobile stations or cell phones communicate with base stations using radio frequency signals. In many instances, there is a need for amplification at the base station.

When higher power amplification is required, multiple power amplifiers typically are stacked up to generate higher power. FIG. 1 schematically shows a known arrangement for stacking multi-carrier linear amplifiers. The assembly 20 in FIG. 1 includes a plurality of amplifiers 22, 24 and 26. A power splitter 30 works in a known manner such that an input signal is provided to the amplifiers. A combiner 32 combines the outputs of the amplifiers and provides the amplified output. There are several shortcomings and drawbacks associated with such arrangements.

Many known combiners introduce significant loss within such amplification arrangements. For example, a typical combiner does not provide a power level that equals the sum of the power levels of all of the amplifiers. In one example, where the amplifiers have a total of 240 watts of available power, the combiner reduces that to about 200 watts because of the nature of the combiner. Moreover, when only one of the amplifiers is working properly, the resultant output from the combiner is even less than the power available from that single amplifier.

It has been proposed to provide reconfigurable combiners that recognize how many of the amplifiers are working or connected so that the combiner can avoid such a significant loss. Such arrangements have the drawback, however, of introducing additional expense into an amplifier configuration. Further, even with such combiners, the resulting power is less than the sum total of the amplifier powers (i.e., there still is loss introduced by the combiner when stacking the amplifiers). Additionally, known combiner arrangements are not well-suited to being modified in the field. Accordingly, whenever additional power is needed at a base station, an entirely new amplifier configuration often needs to be installed. This introduces additional expense and labor cost.

There is a need for an improved amplifier arrangement that allows for combining amplifiers for higher power in an efficient (i.e., lossless) and economical manner. The present invention addresses those needs.

SUMMARY OF THE INVENTION

The present invention provides for an improved amplifier arrangement allowing for combining amplifiers for higher power in an efficient (i.e., lossless) manner.

An examplary amplifier device for amplifying a signal having a selected wavelength includes an amplifier. A plurality of conductors are coupled in parallel to an output of the amplifier. Each of the conductors has an electrical length corresponding to N/4 of the selected wavelength of the signal. N is an odd integer. A shorted one of the conductors operates as an open circuit relative to the output. The plurality of conductors allows for configuring the amplifier device to be used alone or in combination with other amplifiers to meet the needs of any particular situation.

In one example, at least one of the plurality of conductors has a resistance that is lower than a resistance of the other conductors. The lower resistance conductor is used as an output when the amplifier is combined with another amplifier. Another one of the conductors is used as an output if the amplifier is used alone.

The various features and advantages of this invention will become apparent to those skilled in the art from the following detailed description. The drawings that accompany the detailed description can be briefly described as follows.

DETAILED DESCRIPTION

Figure 1:
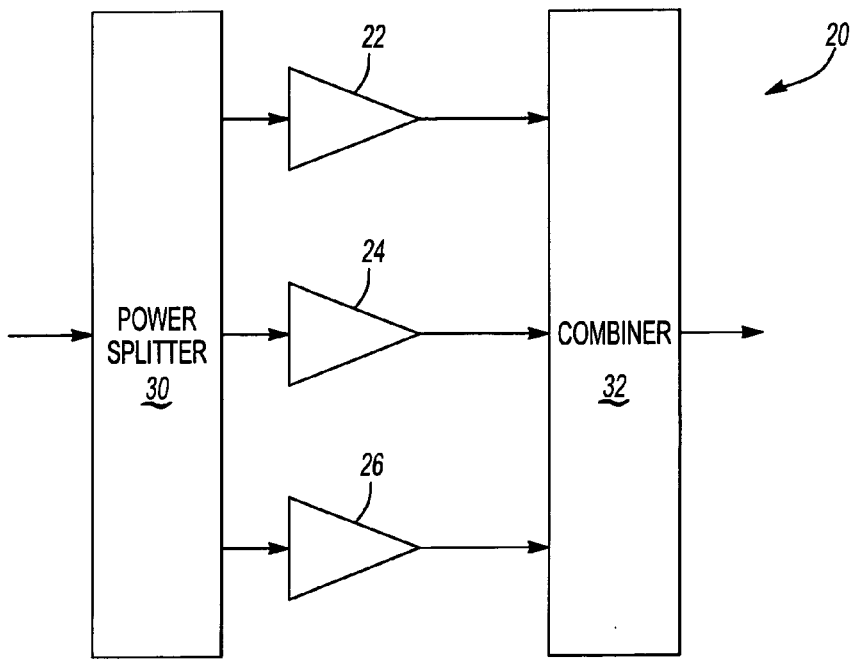
FIG. 1 schematically shows a multi-carrier power amplifier arrangement from the prior art.
Figure 2:
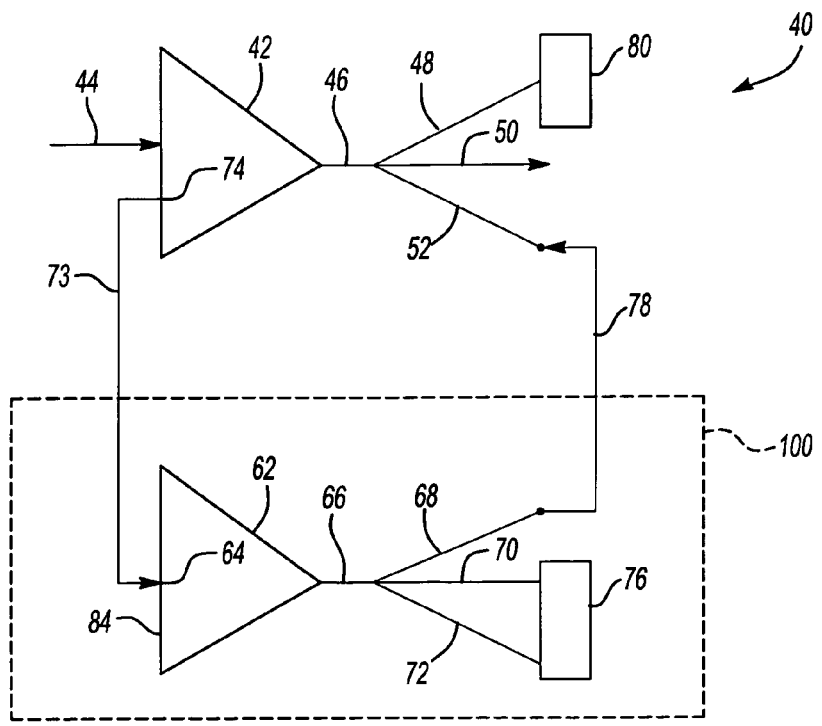
FIG. 2 schematically shows an example power amplifier device designed according to an embodiment of this invention.

FIG. 2 schematically shows an amplifier device 40 that includes a first amplifier 42 that operates in a generally known manner. The amplifier 42 has an input 44 and an output 46. A plurality of conductors 48, 50 and 52 are connected to the output 46 in parallel with each other. The conductors 48, 50 and 52 each have an electrical length that corresponds to a quarter wave of the wavelength of a signal to be amplified by the amplifier 42. In one example, the electrical length of the conductors 48, 50 and 52 is N/4 the signal wavelength, where N is an odd integer.

In one example, each of the conductors 48, 50 and 52 is a low impedance transmission line. In the illustrated example, the conductor 48 has a 50 ohm impedance, the conductor 50 has a 35 ohm impedance and the conductor 52 has a 50 ohm impedance.

The conductors 48, 50 and 52 have electrical lengths that correspond to quarter wavelengths of the processed signal wavelength and, therefore when any of them is shorted, it appears as an open circuit at the output of the corresponding amplifier. In other words, shorting any one of the conductors 48, 50 or 52 effectively removes it from the circuit from an RF perspective. The example configuration has the advantage of being readily configured for using the amplifier 42 alone or stacked with another amplifier as illustrated in FIG. 2.

The example amplifier device 40 includes a second amplifier 62 having an input 64 and an output 66. A plurality of conductors 68, 70 and 72 are coupled to the output 66 and parallel to each other in the same manner that the conductors 48, 50 and 52 are coupled to the output 46. In the illustrated example, the conductor 68 has the same characteristics (i.e., electrical length and impedance) as the conductor 48, the conductor 70 has the same characteristics as the conductor 50 and the conductor 72 has the same characteristics as the conductor 52.

The arrangements shown in FIG. 2 has the amplifiers 42 and 62 combined for increased amplification of a signal at the input 44. In this example, a conductor 73 couples a secondary output 74 of the amplifier 42 to the input 64 of the amplifier 62. A similar secondary output 84 on the amplifier 62 is shorted. In one example, the conductor 73 is a RF U-link. Any known conductor for transferring this signal received at the input 44 to the input 64 could be used. In the illustrated example, the conductors 70 and 72 are connected to a shorting block 76 and therefore operate as an open circuit connected to the output 66. Accordingly, the output signal from the amplifier 62 will be transmitted along the conductor 68 without any loss being introduced by the presence of the conductors 70 and 72. The conductors 70 and 72 have electrical lengths that correspond to quarter wavelengths of the processed signal wavelength and, therefore when they are shorted, they appear as an open circuit at the output of the corresponding amplifier.

It should be noted that when this description uses the term "lossless" or the phrase "without any loss" that should be interpreted with the understanding that there may be some inherent material loss associated with an amplifier or a conductor, for example. That terminology as used in this description is intended to distinguish the disclosed example from previous arrangements that had inherent loss as a result of combining amplifiers using a combiner, for example. The illustrated arrangement is effectively lossless in that the only power loss is associated with material loss inherent to the amplifier devices or the conductors, themselves. In other words, the disclosed example is lossless because the combined output power is the same as the sum total of the amplifier powers. Combining the example amplifiers or using them separately does not introduce any loss not already inherent in the individual components.

A conductor 78 couples the conductor 68 to the conductor 52, which operates as an input in this example to propagate the output from 68 to be combined with the output at 46.

The conductor 48 is connected to a shorting block 80 so that it operates as an open circuit relative to the output 46. The conductor 50 provides the ultimate output of the amplifier device 40 in this example. The outputs of the amplifiers 42 and 62 are combined and provided as an output from the device 40 along the conductor 50.

Figure 3:
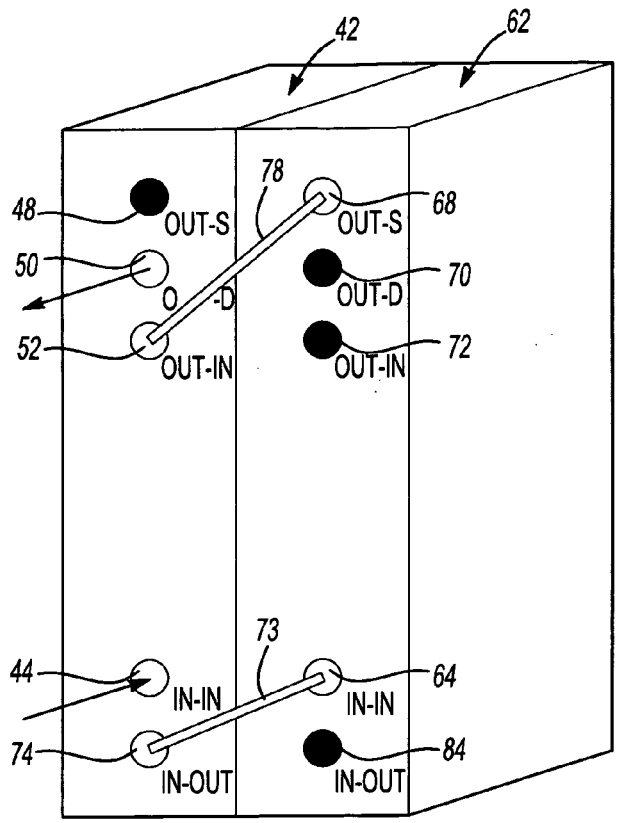
FIG. 3 schematically shows one implementation of an arrangement as shown in FIG. 2.

The daisy chain configuration of FIG. 2 lends itself to a modular approach for utilizing the disclosed amplifier device configuration. FIG. 3 diagrammatically shows one such modular approach. Each of the amplifiers 42 and 62 is provided as a packaged module with the plurality of conductors terminating in accessible connectors as schematically shown. For purposes of combining the output powers of the amplifiers 42 and 62, the connections schematically shown in FIG. 2 are accomplished in FIG. 3 by readily plugging in suitable conductors (i.e., U-links) as shown. Therefore, the arrangement shown in FIG. 2 is easily accomplished in the field. The signal input is connected to a connector corresponding to the input 44 and the output is obtained from a connector associated with the terminal end of the conductor 50. The connectors that are shown solid black in FIG. 3 are shorted, which can be accomplished using one or more shorting blocks, for example.

As can be appreciated from FIG. 3, a modular approach using the disclosed arrangement is possible so that an amplifier device having the configuration shown in FIG. 3 can be easily configured for stacking the amplifiers. It can also be appreciated from FIG. 3 how the modular approach would allow for additional amplifiers to be provided for further increasing amplification as may be needed at a later date.

Figure 4:
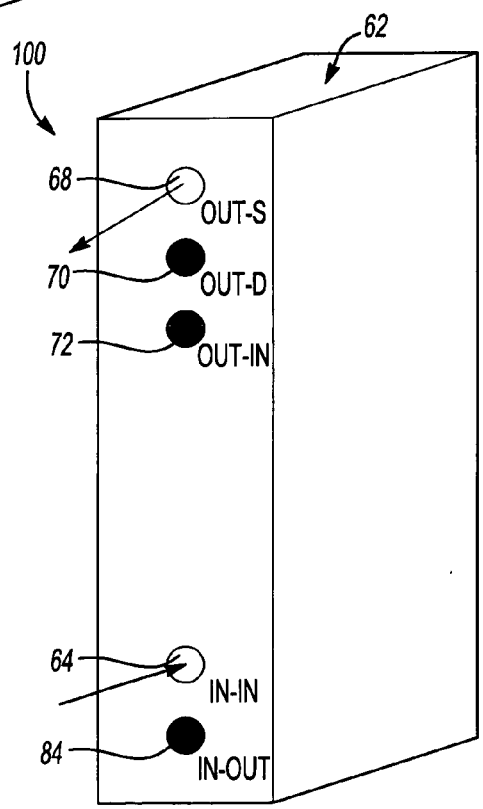
FIG. 4 schematically shows one implementation of a portion of the embodiment of FIG. 2.

Moreover, the configuration of FIGS. 2 and 3 can readily be used for amplification using only one of the amplifiers. This is accomplished by configuring one of the amplifiers as shown at 100 in FIG. 2. The modular approach corresponding to the portion 100 is shown in FIG. 4. By having the input signal fed to the input 64 and shorting the conductors 70 and 72, the amplifier 62 provides its design output (i.e., the rated amplifier power) along the conductor 68. Again, because the conductors 70 and 72 are shorted, they operate as open circuits and have no impact on the operation of the amplifier 62. In the example of FIG. 4, the secondary output 84 is not needed and it is shorted.

If a module as shown in FIG. 3 were provided for a cellular base station, for example, and the amplification power of only one of the amplifiers were needed, either one of them could be configured as shown at 100 in FIG. 2 or 4 without making any connection to the other. Such an installation would have the advantage of being able to be reconfigured later by simple wired connections between the modules to stack the amplifiers for increased amplification on an as-needed basis. The disclosed example provides the significant advantage of being readily reconfigured in the field to meet changing amplification needs that may arise over time.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. An amplifier device for amplifying a signal having a selected wavelength, comprising:
   an amplifier having an output; and
   a plurality of conductors in parallel and coupled to the output, each of the conductors having an electrical length corresponding to N/4 of the wavelength, where N is an odd integer, such that a shorted one of the conductors operates as an open circuit relative to the output, at least one of the plurality of conductors has a resistance lower than a resistance of the other conductors, and is used as an output if an output of the amplifier is combined with an output from another amplifier.

2. An amplifier device for amplifying a signal having a selected wavelength, comprising:
   an amplifier having an output;
   a plurality of conductors in parallel and coupled to the output, each of the conductors having an electrical length corresponding to N/4 of the wavelength, where N is an odd integer, such that a shorted one of the conductors operates as an open circuit relative to the output;
   a second amplifier having a second output;
   a plurality of second conductors in parallel and coupled to the second output, each of the second conductors having an electrical length corresponding to N/4 of the wavelength, where N is an odd integer; and wherein
   a selected one of the second conductors is coupled to one of the plurality of conductors distal from the output and another one of the plurality of conductors provides an amplified output that combines outputs of the amplifiers.

3. The device of claim 2, wherein the one conductor coupled to the selected one of the second conductors has a higher resistance than the other conductor that provides the amplified output.

4. The device of claim 3, wherein the selected second conductor has a higher resistance than the other conductor that provides the amplified output.

5. The device of claim 2, wherein a remainder of the plurality of conductors and a remainder of the plurality of second conductors are shorted.

6. An amplifier device for amplifying a signal having a selected wavelength, comprising:
an amplifier having an output; and
a plurality of conductors in parallel and coupled to the output, each of the conductors having an electrical length corresponding to N/4 of the wavelength, where N is an odd integer, such that a shorted one of the conductors operates as an open circuit relative to the output, a first one of the conductors provides an amplified output from the amplifier, a second one of the conductors provides a combined amplified output if the amplifier is combined with another amplifier and a third one of the conductors operates as an input to receive an output from another amplifier.

7. The device of claim 6, wherein the second and third conductors are shorted when the first conductor provides the amplified output.

8. The device of claim 6, wherein the first conductor is shorted when the second conductor provides the combined amplified output and the third conductor is coupled to another amplifier.

9. A method of amplifying a radio frequency signal, comprising the steps of:
providing an amplifier having an output coupled to a plurality of parallel conductors that have an electrical length corresponding to N/4 the wavelength of the radio frequency signal; and
selectively shorting at least one of the plurality of conductors such that the shorted conductor operates as an open circuit at the amplifier output;
providing a second amplifier having an output coupled to a second plurality of parallel conductors that have an electrical length corresponding to N/4 the wavelength of the radio frequency signal; and
coupling one of the second conductors to one of the conductors for amplifying the radio frequency signal using the combined amplifiers.

10. The method of claim 9, wherein each plurality of conductors includes three conductors and the method comprises:
shorting two of the second plurality of conductors;
shorting a selected on of the conductors; and
using a third one of the conductors to obtain the amplified signal.

11. The method of claim 10, wherein the third one of the conductors has a lower impedance than other conductors in the plurality of conductors.

12. A method of amplifying a radio frequency signal, comprising the steps of:
providing an amplifier having an output coupled to a plurality of parallel conductors that have an electrical length corresponding to N/4 the wavelength of the radio frequency signal; and
selectively shorting at least one of the plurality of conductors such that the shorted conductor operates as an open circuit at the amplifier output;
shorting all but one of the plurality of conductors; and
using the amplifier to amplify the signal as a single amplifier.

13. A method of amplifying a radio frequency signal, comprising the steps of:
providing an amplifier having an output coupled to a plurality of parallel conductors that have an electrical length corresponding to N/4 the wavelength of the radio frequency signal; and
selectively shorting at least one of the plurality of conductors such that the shorted conductor operates as an open circuit at the amplifier output;
shorting one of the conductors;
coupling another one of the conductors to an output from another amplifier; and
using a third one of the conductors to obtain an output comprising the amplified radio frequency signal.

* * * * *